US010959333B2

(12) United States Patent
Inoue (10) Patent No.: US 10,959,333 B2
(45) Date of Patent: Mar. 23, 2021

(54) SEMICONDUCTOR DEVICE

(71) Applicant: FUJI ELECTRIC CO., LTD., Kawasaki (JP)

(72) Inventor: Daisuke Inoue, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 22 days.

(21) Appl. No.: 16/670,356

(22) Filed: Oct. 31, 2019

(65) Prior Publication Data
US 2020/0205292 A1 Jun. 25, 2020

(30) Foreign Application Priority Data
Dec. 19, 2018 (JP) .............................. JP2018-237256

(51) Int. Cl.
*H05K 1/05* (2006.01)
*H05K 1/18* (2006.01)
*H01L 23/00* (2006.01)

(52) U.S. Cl.
CPC ............. *H05K 1/183* (2013.01); *H01L 24/45* (2013.01); *H05K 1/05* (2013.01)

(58) Field of Classification Search
CPC ........... H05K 1/183; H05K 1/05; H01L 24/45
USPC ........................................................ 361/783
See application file for complete search history.

(56) References Cited

U.S. PATENT DOCUMENTS

| 6,791,174 B2* | 9/2004 | Matsuo | H01L 23/16 257/680 |
|---|---|---|---|
| 6,914,321 B2* | 7/2005 | Shinohara | H01L 23/4334 257/678 |
| 2011/0298121 A1* | 12/2011 | Nishibori | H01L 23/49861 257/713 |
| 2014/0035123 A1* | 2/2014 | Oka | H01L 23/49811 257/712 |
| 2014/0198454 A1* | 7/2014 | Yuan | H01L 25/165 361/720 |
| 2016/0104631 A1* | 4/2016 | Guth | H01L 23/49811 361/728 |
| 2016/0148865 A1* | 5/2016 | Naoe | H01L 24/32 257/773 |

(Continued)

FOREIGN PATENT DOCUMENTS

JP S5552685 Y2 12/1980
JP S5889942 U 6/1983

(Continued)

*Primary Examiner* — Sherman Ng
(74) *Attorney, Agent, or Firm* — Rabin & Berdo, P.C.

(57) ABSTRACT

A semiconductor device includes a semiconductor element on an insulated circuit board, a housing having a side wall surrounding the circuit board, a lead terminal including a lead part and a terminal part extending orthogonal to the lead part, the terminal part having a base portion adjacent to the lead part and being embedded in the side wall, the remaining portion of the terminal part being exposed from the side wall and being connected to the semiconductor element via a wiring member, and a sealing resin provided in the housing. The side wall has an anchor part formed in an inner surface at a position within an area where the lead part is embedded and above the terminal part, the anchor part including concave portions that are each defined by a pair of opposed surfaces parallel to each other and orthogonal to the upper surface of the insulation plate.

8 Claims, 7 Drawing Sheets

(56) References Cited

U.S. PATENT DOCUMENTS

2016/0315023 A1* 10/2016 Yoshida ............... H05K 1/0209
2018/0323120 A1* 11/2018 Harada .................. H01L 23/20

FOREIGN PATENT DOCUMENTS

| JP | S59149602 U | 10/1984 |
| JP | S6425445 A | 1/1989 |
| JP | 2014197634 A | 10/2014 |
| JP | 2015162649 A | 9/2015 |
| JP | 2016100475 A | 5/2016 |

* cited by examiner

SEMICONDUCTOR DEVICE

CROSS REFERENCE TO RELATED APPLICATION

This application is based upon and claims the benefit of priority from the prior Japanese Patent Application No. 2018-237256, filed on Dec. 19, 2018; the entire contents of which are incorporated herein by reference.

BACKGROUND

Technical Field

The present invention relates to a semiconductor device.

Related Art

A semiconductor device has a substrate provided with a semiconductor element such as an insulated gate bipolar transistor (IGBT), a power metal oxide semiconductor field effect transistor (power MOSFET), a free wheeling diode (FWD) or the like, and is used for an inverter device or the like. This type of semiconductor device is configured by arranging the semiconductor element on a metal foil formed on the surface of an insulated substrate. The semiconductor element is, for example, fixed on the metal foil via a bonding material such as solder. The insulated substrate and the semiconductor element are surrounded by a case.

In general, when an IGBT module operates, the temperature of a semiconductor element increases. Therefore, as the operation time of the IGBT module becomes longer, cracks may occur in the bonding material between the semiconductor element and the substrate or below a power terminal, or deterioration of a wire bonded to the semiconductor element may progress. In order to solve these drawbacks, a technique for sealing the semiconductor element disposed in the case with a resin has been proposed (for example, refer to Patent Document 1).

In Patent Document 1, in order to prevent the sealing resin from being peeled off from the case, an uneven shape is provided on an inner surface of the case. The uneven shape is configured by a convex portion whose horizontal width increases toward the inner side in the horizontal direction of the case and a concave portion whose horizontal width increases toward the outer side in the horizontal direction of the case. Further, the horizontal width of the concave portion increases toward the upper side in the vertical direction of the case.

Patent Document 1: Japanese Patent Laid-Open No. 2015-162649

However, in Patent Document 1, since the uneven shape has an acute angled portion, there is a problem that the life of a mold for the case may be shortened and the running cost of the mold increase. Further, at the time of filling the interior of the case with the sealing resin, there is another problem that air bubbles are caught by a narrowed portion of the concave portion and are hardly removed.

In view of the above problems, the present invention intends to provide a semiconductor device capable of improving the removal of air bubbles at the time of resin sealing while suppressing the running cost of the mold.

SUMMARY

A semiconductor device according to one aspect of the present invention includes an insulated circuit board including an insulation plate with an upper surface and a lower surface, a first metal layer disposed on said upper surface of the insulation plate, and a second metal layer disposed on the lower surface of the insulation plate, a semiconductor element disposed on the first metal layer via a bonding material, a housing having an inner space therein in which the insulated circuit board and the semiconductor element are disposed, and having a side wall surrounding the inner space, the side wall having an inner surface facing the circuit board and the semiconductor element, and having an anchor part formed in the inner surface, a lead terminal including a lead part, a part of which is embedded in the side wall of the housing, and a remaining portion of which protrudes upward from the side wall of the housing, the lead part extending in a direction parallel to the inner surface of the side wall and orthogonal to the upper surface of the insulation plate, and a terminal part connected to the lead part and extending in a direction orthogonal to a direction of the lead part, the terminal part having a base portion adjacent to the lead part and being embedded in the side wall of the housing, a remaining portion of the terminal part other than the base portion having an upper surface parallel to the upper surface of the insulation plate, a part of the upper surface of the remaining portion of the terminal part being exposed from the side wall of the housing, a wiring member having two ends opposite to each other, one of the two end of the wiring member being connected to the upper surface of the terminal part that is exposed from the side wall so as to electrically connect the semiconductor element to the lead terminal, and a sealing resin provided in the inner space of the housing to seal the insulated circuit board, the semiconductor element, the wiring member, and the terminal part. The anchor part is disposed at a position within an area where the lead part is embedded and above the terminal part, the anchor part including a plurality of concave portions or convex portions, each of the concave portions or the convex portions being defined by a pair of opposed surfaces that are parallel to each other and are orthogonal to the upper surface of the insulation plate.

According to the present invention, it is possible to improve the removal of air bubbles at the time of resin sealing while suppressing the running cost of the mold.

DETAILED DESCRIPTION OF THE INVENTION

Figure 1:
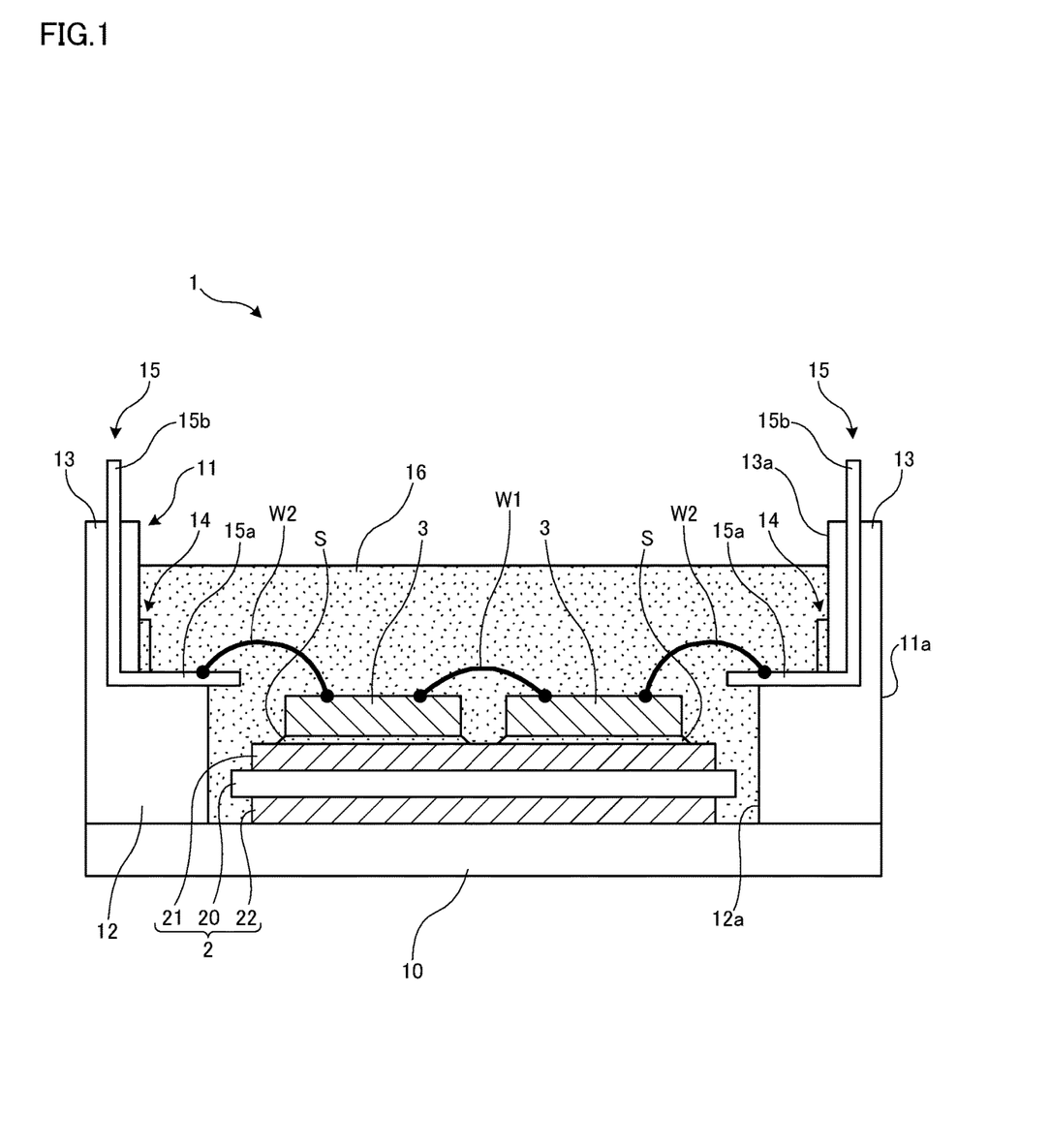
FIG. 1 is schematic cross-sectional view illustrating an example of a semiconductor device according to the present embodiment.

Hereinafter, a semiconductor device to which the present invention can be applied will be described. FIG. 1 is a schematic cross-sectional view illustrating an exemplary semiconductor device according to the present embodiment. Note that the semiconductor device described below is merely an example, and the present invention is not limited to this and can be changed appropriately.

A semiconductor device 1 is, for example, applied to a power conversion device such as a power module. As illustrated in FIG. 1, the semiconductor device 1 includes an insulated circuit board 2, and semiconductor elements 3 disposed on an upper surface of the insulated circuit board 2. The semiconductor device 1 further includes a case 11 that surrounds the insulated circuit board 2 and the semiconductor elements 3. Further, the semiconductor device 1 may include a base plate 10. For example, the base plate 10 has a rectangular shape in plan view, and is formed of a metal (e.g., copper) plate. The surface of the base plate 10 is, for example, plated. The base plate 10 may have cooling fins. The semiconductor device 1 may have a cooler including a base plate, fins, and a jacket, instead of the base plate 10.

The insulated circuit board 2 is configured by metal layers and an insulation layer, which are laminated, and is formed in a rectangular shape in plan view so as to be smaller than the upper surface of the base plate 10. Specifically, the insulated circuit board 2 includes an insulation plate 20 with an upper surface (one surface) and a lower surface (the other surface) opposed to the upper surface, a first metal layer 21 disposed on the upper surface of the insulation plate 20, and a second metal layer 22 disposed on the lower surface of the insulation plate 20. The insulation plate 20, the first metal layer 21, and the second metal layer 22 may be identical or different in thickness.

The insulation plate 20 is formed of an insulator such as ceramic, and each of the first metal layer 21 and the second metal layer 22 is formed of, for example, a copper foil. The first metal layer 21 configures a circuit layer electrically connected to the semiconductor elements. The first metal layer 21 has a flat surface and has a rectangular shape that substantially covers the entire upper surface of the insulation plate 20 in plan view. Specifically, the outer edge of the first metal layer 21 is positioned slightly inside the outer edge of the insulation plate 20. The first metal layer 21 may be provided with a circuit pattern that configures a circuit. The first metal layer 21 may include a plurality of metal layers.

The second metal layer 22 has a flat surface and has a rectangular shape that substantially covers the entire lower surface of the insulation plate 20 in plan view. Specifically, the outer edge of the second metal layer 22 is positioned slightly inside the outer edge of the insulation plate 20.

The insulated circuit board 2 having the above-described configuration may be, for example, a direct copper bonding (DCB) substrate or an active metal brazing (AMB) substrate. The insulation plate 20 may be formed using a ceramic material such as alumina ($Al_2O_3$), aluminum nitride (AlN), or silicon nitride ($Si_3N_4$). The insulated circuit board 2 may be disposed at the center of the upper surface of the base plate 10. Thus, a ring space is formed in an outer peripheral portion of the upper surface of the base plate 10.

The semiconductor elements 3 are disposed on an upper surface of the first metal layer 21 of the insulated circuit board 2. The semiconductor element 3 is, for example, formed of a semiconductor substrate, such as silicon (Si) or silicon carbide (SiC). The semiconductor element 3 has, for example, a rectangular shape in plan view. Two semiconductor elements 3 are disposed side by side in the longitudinal direction, for each first metal layer 21. Each semiconductor element 3 is disposed on the first metal layer 21 via a bonding material S such as solder. Thus, the semiconductor element 3 is electrically connected to the first metal layer 21.

A switching element such as an insulated gate bipolar transistor (IGBT) or a power metal oxide semiconductor field effect transistor (MOSFET), or a diode such as a free wheeling diode (FWD), is usable as the semiconductor element 3. Further, a reverse conducting (RC)-IGBT in which IGBT and FWD are integrated, or a reverse blocking (RB)-IGBT having an enough withstand voltage against reverse bias, may be usable as the semiconductor element 3.

Two semiconductor elements 3 are electrically connected by a wiring member W1. Each semiconductor element 3 is electrically connected to a lead terminal 15, which is described below, via a wiring member W2.

A conductor wire is used for each wiring member described above. Any one of gold, copper, aluminum, gold alloy, copper alloy, and aluminum alloy, or a combination thereof is selectable as the material of the conductive wire. It is also possible to use a member other than the conductive wire as the wiring member. For example, a ribbon can be used as the wiring member.

The case 11 is a housing for accommodating the insulated circuit board 2 and the semiconductor element 3. The case 11 includes a side wall 11a assembled in a frame shape in plan view. The side wall 11a is disposed around the insulated circuit board 2 and the semiconductor elements 3, and defines a region to be filled with a sealing resin 16 described below. The side wall 11a of the case 11 may include an annular bottom wall part (a lower side wall) 12 that surrounds the outer peripheral side of the insulated circuit board 2, and a vertical wall part (side wall, an upper side wall) 13 that extends upward from an upper surface of the bottom wall part 12. The case 11 is, for example, made of a synthetic resin. The case 11 may be molded, for example, from a resin such as polyphenylene sulfide (PPS). In addition to PPS, the resin for the case 11 is selectable from insulating resins such as polybutylene telephthalate (PBT), polybutyl acrylate (PBA), polyamide (PA), acrylonitrile butadiene styrene (ABS), liquid crystal polymer (LCP), polyether ether ketone (PEEK), polybutylene succinate (PBS), urethane, and silicon. The resin to be selected may be a mixture of two or more resins. The resin may contain filler (for example, glass filler) for enhancing the strength and/or functionality.

The bottom wall part 12 is formed in a square ring shape in plan view that corresponds to the shape of the base plate 10. The bottom wall part 12 is disposed on the upper surface of the base plate 10 at the outer periphery of the insulated circuit board 2. The outer surface of the bottom wall part 12 is continuous with the outer edge of the base plate 10. The bottom wall part 12 has an inner surface 12a provided at a position spaced with a gap with respect to the outer edge of the insulation plate 20. Further, the upper surface of the bottom wall part 12 is substantially parallel to the upper surface of the insulation plate 20, and is provided at a position higher than the upper surface of the semiconductor element 3 on the insulated circuit board 2.

The vertical wall part 13 rises upward, at the side wall 11a, from the outer edge of the bottom wall part 12, in a direction from the lower surface to the upper surface of the insulation plate 20. The thickness of the vertical wall part 13 in the horizontal direction is smaller than the thickness of the bottom wall part 12 in the horizontal direction. More specifically, the outer surface of the vertical wall part 13 is continuous with the outer surface of the bottom wall part 12, and an inner surface 13a of the vertical wall part 13 is positioned outside than the inner surface 12a of the bottom wall part 12. The inner surface 13a of the vertical wall part 13 may be substantially orthogonal to the upper surface of the bottom wall part 12. Although described in detail below, an anchor part 14 is formed on the inner surface 13a of the vertical wall part 13, between the vertical wall part 13 and the bottom wall part 12. The vertical wall part 13 may rise in a square ring shape in plan view, like the bottom wall part 12, or may has a shape partly rising from the upper surface of the bottom wall part 12. The vertical wall part 13 may be integral molded together with the lead terminals 15 when provided in the case 11 or may be provided by two-color molding.

As illustrated in FIG. 1, the case 11 has an L-shaped cross section cut in the direction including the bottom wall part 12 and the vertical wall part 13. The case 11 having the above configuration is bonded using, for example, an adhesive (not illustrated) in a state where a lower surface of the bottom wall part 12 is opposed to the upper surface of the base plate 10.

The lead terminal 15, serving as an external terminal, is embedded in the vertical wall part 13 and the bottom wall part 12. The lead terminal 15 may be integrated with the case 11 by insert molding. The lead terminal 15 has a terminal part 15a on one end side and a lead part 15b on the other end side. The terminal part 15a extends in a direction parallel to the upper surface of the insulation plate 20 in the case 11. The terminal part 15a may be flat. The lead part 15b rises from the edge of the terminal part 15a in a direction perpendicular to the upper surface of the insulation plate 20. The lead terminal 15 maybe L-shaped when seen in cross section.

The terminal part 15a, which is one end side of the lead terminal 15, has a flat planar shape along a direction of a surface of the semiconductor element 3 and extends from the base end of the vertical wall part 13 toward the inner side of the case 11. The terminal part 15a has a predetermined thickness in the thickness direction of the semiconductor element 3. Further, the terminal part 15a is partly embedded in the bottom wall part 12. Specifically, a lower surface and side surfaces of the terminal part 15a are partly embedded in the bottom wall part 12 so that an upper surface thereof is exposed from the bottom wall part 12. One end of the wiring member W2 is connected to the exposed upper surface of the terminal part 15a. Further, the tip of the terminal part 15a slightly protrudes from the inner surface 12a of the bottom wall part 12.

Figure 3:
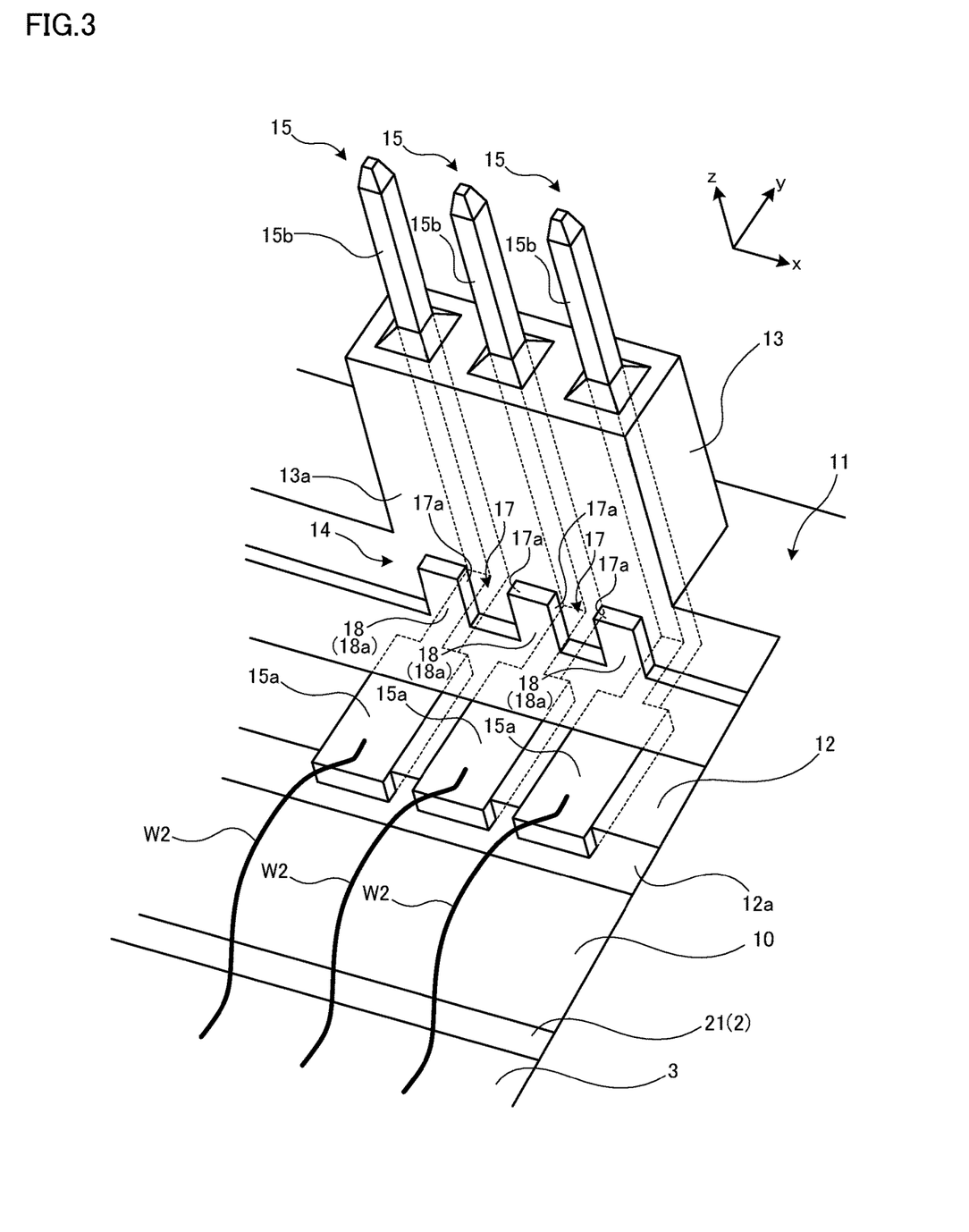
FIG. 3 is a perspective view illustrating another example of the semiconductor device according to the present embodiment.

The lead part 15b, which is the other end side of the lead terminal 15, is continuous with the outer end of the terminal part 15a and is bent in such a way as to rise upward from the base end of the vertical wall part 13 (see FIG. 3). Most of the lead part 15b rising upward is embedded in the vertical wall part 13. The upper end, which is the tip of the lead part 15b, protrudes from the upper surface of the vertical wall part 13 by a predetermined length. The lead part 15b may have a polygonal or circular cross section. The lead part 15b may be a press-fit pin.

Although in FIG. 1 two lead terminals 15 are disposed to face each other with the semiconductor elements 3 interposed therebetween, the number of lead terminals 15 to be arranged is not limited to the illustrated example and can be changed appropriately. The lead terminal 15 to be provided may be only one. Alternatively, a plurality of lead terminals 15 may be arranged in the circumferential direction of the semiconductor device 1 as illustrated in FIG. 3 described below.

The interior space of the case 11 defined by the side wall 11a is sealed by the sealing resin 16. Specifically, the sealing resin 16 seals the insulated circuit board 2, the semiconductor elements 3, the wiring members W1 and W2, and the terminal parts 15a provided in the case 11. An epoxy resin or silicone gel can be used for the sealing resin 16. In a state where the case 11 is filled with the sealing resin 16, the top of the sealing resin 16 is positioned higher than the anchor part 14 described below so as to cover the anchor part 14. The upper and lower surfaces of each terminal part 15a at the tip thereof are fixed by the sealing resin 16.

By the way, a technique for sealing the interior of the case with a sealing resin, like the above-described semiconductor device, is conventionally proposed, for the purpose of preventing the temperature of the semiconductor element from increasing when the semiconductor device is operating and preventing the wiring members and the bonding material from deteriorating during a long-term operation.

In such a structure, the sealing resin expands and contracts during the long-term operation of the semiconductor device. Accordingly, it is assumed that a shearing stress is generated at a connection portion between the wiring member and the bonding material described above, and consequently, the connection portion is disconnected. Therefore, an epoxy-based material that is relatively close to the semiconductor element, such as silicon, in linear expansion coefficient is used for the sealing resin.

However, since there is a large difference in linear expansion coefficient between the case material and the sealing resin, another problem that the sealing resin is peeled off from the case due to a heat cycle caused by heat generation of the semiconductor element or external atmospheric change may arise. Therefore, there is a possibility that the wiring member may be cut or moisture absorption may occur in a gap caused by the peeling off, thereby deteriorating the reliability of the semiconductor device. Accordingly, for example, in anticipation of anchor effects, a measure for suppressing the sealing resin from being peeled off from the case by configuring a component surface to have an uneven shape is adopted.

Figure 2A:
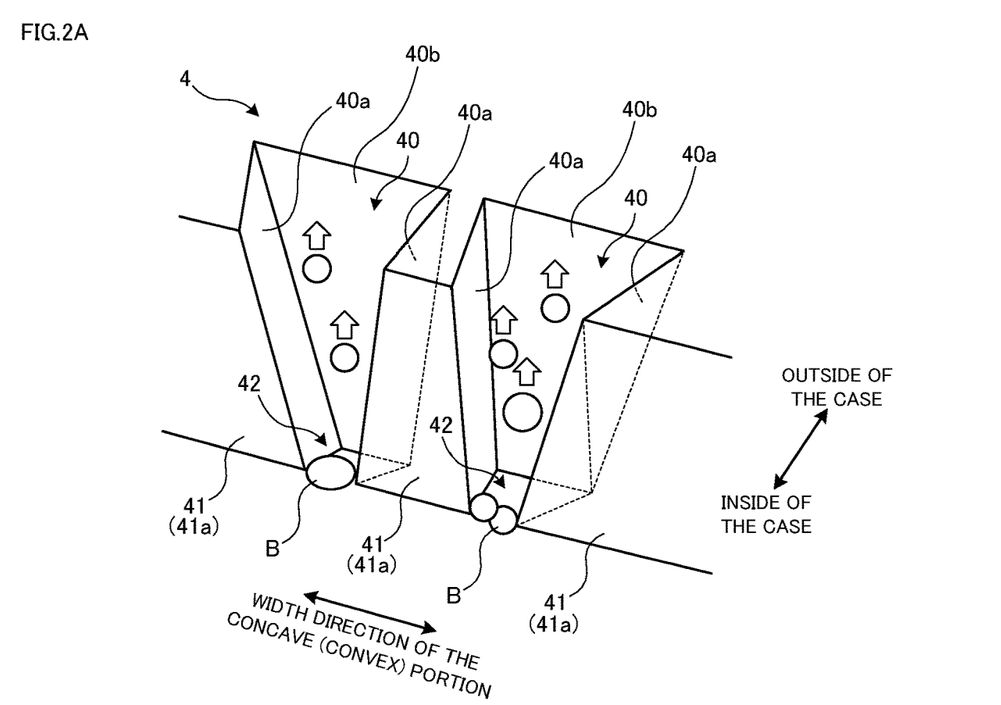
FIGS. 2A and 2B are perspective views schematically illustrating an anchor part according to a comparative example and an anchor part according to the present embodiment.
Figure 2B:
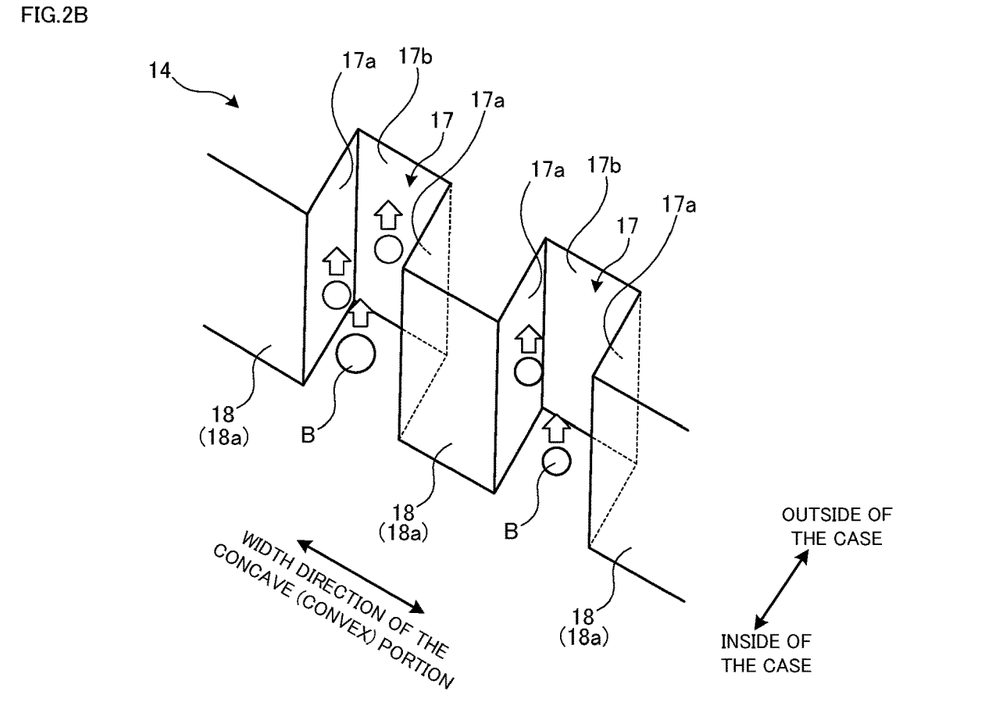

This measure will be described with reference to FIGS. 2A and 2B. FIGS. 2A and 2B are perspective views schematically illustrating an anchor part according to a comparative example and an anchor part according to the present embodiment. Specifically, FIG. 2A illustrates a perspective view of the anchor part according to the comparative example, and FIG. 2B illustrates a perspective view of the anchor part according to the present embodiment.

As illustrated in FIG. 2A, the anchor part 4 according to the comparative example has an uneven shape provided on the inner surface of the case. Specifically, the anchor part 4 is configured by concave portions 40 and convex portions 41 extending in the vertical direction and alternately arranged. The concave portions 40 and the convex portions 41 are alternately disposed side by side in the circumferential direction of the case.

The horizontal width of the concave portion 40 (the width in the circumferential direction of the case (which may be referred to as right-and-left width)) increases toward the outside from the inside of the case. The concave portion 40 is wedge-shaped, and the horizontal width of the concave portion 40 increases toward the upper side from the lower side in the vertical direction of the case.

On the other hand, the horizontal width of the convex portion 41 (the width in the circumferential direction of the case) decreases toward the outside from the inside of the case. The horizontal width of the convex portion 41 decreases toward the upper side from the lower side in the vertical direction of the case.

That is, a pair of opposed surfaces 40a that define the concave portion 40 or the convex portion 41 are disposed inclinedly with respect to each other. The pair of opposed surfaces 40a face each other in the circumferential direction of the case, that is, in the width direction of the concave portion 40 or the convex portion 41. The ends of the pair of opposed surfaces 40a, outside the case, are continuous with an inner surface 40b of the concave portion 40.

Therefore, acute angled portions are formed at corners of the concave portions 40 and corners of the convex portions 41. Specifically, the angle formed by the opposed surface 40a and the inner surface 40b is an acute angle. The angle formed by a side surface 41a of the convex portion 41 and the opposed surface 40a is an acute angle.

When a case is configured to have such acute angled portions, a mold for forming the case has acute angled portions correspondingly. This causes a problem that the wear increases and the running cost of the mold increases. Further, as illustrated in FIG. 2A, a narrowed portion 42 is formed at the lower end of each concave portion 40. Therefore, this may cause a problem that, at the time of filling the interior of the case with the sealing resin, air bubbles B at the bottom part of the case are caught by respective narrowed portions 42 and cannot escape upward.

Accordingly, the present inventor has conceived the present invention by focusing on the shape of the anchor part for obtaining anchor effects of the sealing resin so as to improve the removal of air bubbles at the time of resin sealing while suppressing the running cost of the mold.

The anchor part 14 according to the present embodiment is configured to have an uneven shape provided on an inner surface of the case 11 (not illustrated), as illustrated in FIG. 2B. Specifically, the anchor part 14 is configured by concave portions 17 and convex portions 18 extending in the vertical direction and alternately arranged. The concave portions 17 and the convex portions 18 are alternately disposed side by side in the circumferential direction of the case.

The horizontal width of the concave portion 17 (the width in the circumferential direction of the case (which may be referred to as right-and-left width)) is uniform from the inside to the outside of the case. The horizontal width of the concave portion 17 is uniform from the lower side to the upper side in the vertical direction of the case.

Similarly, the horizontal width of the convex portion 18 (the width in the circumferential direction of the case) is uniform from the inside to the outside of the case. The horizontal width of the convex portion 18 is uniform from the lower side to the upper side in the vertical direction of the case.

That is, a pair of opposed surfaces 17a that define the concave portion 17 or the convex portion 18 are arranged to be parallel to each other. The pair of opposed surfaces 17a face each other in the circumferential direction of the case, that is, in the width direction of the concave portion 17 or the convex portion 18. The ends of the pair of opposed surfaces 17a, outside the case, are continuous with an inner surface 17b of the concave portion 17.

According to these configurations, no acute angled portion is formed at corners of the concave portions 17 and corners of the convex portions 18. Specifically, the angle formed by the opposed surface 17a and the inner surface 17b is a right angle. The angle formed by a side surface 18a of the convex portion 18 and the opposed surface 17a is a right angle.

Accordingly, a mold for forming a case has no acute angled portion, and the life of the mold can be extended because of reduction of the wear thereof. As a result, an increase in the running cost can be suppressed. In addition, since there is no narrowed potion at the lower end of the concave portion 17, the air bubbles B at the bottom part of the case can be smoothly removed from the concave portion 17 at the time of filling the interior of the case 11 with the sealing resin.

As described above, in the present embodiment, a pair of opposed surfaces 17a that define the concave portion 17 or the convex portion 18 configuring the anchor part 14 are parallel. Thus, while increasing the contact area between the sealing resin 16 (see FIG. 1) and the inner surface of the case 11 to ensure the anchor effects, it is possible to improve the removal of air bubbles at the time of resin sealing while suppressing the running cost of the mold.

Next, with reference to FIG. 3, the layout of the anchor part will be described in detail. FIG. 3 is a perspective view illustrating another example of the semiconductor device according to the present embodiment. In order to define the semiconductor device, in FIG. 3, x direction represents the width direction, y direction represents the depth direction, and z direction represents the height direction. The illustrated x, y, and z axes are orthogonal to each other and form a right-handed system. For convenience of explanation, the x direction may be referred to as right-and-left direction, the y direction as back-and-forth direction, and the z direction as up-and-down direction or vertical direction. These terms may change in correspondence with each of the x, y, and z directions depending on the mounting posture of the semiconductor device to an external device. Further, in the present specification, the plan view means a case where the upper surface of the semiconductor device is viewed from the z-axis positive direction. The semiconductor device illustrated in FIG. 3 is basically the same as that described in FIGS. 1 and 2B in configuration of the anchor part. Compared to FIGS. 1 and 2B, the arrangement of the anchor part is described in more detail in FIG. 3. Therefore, the already described configurations are denoted by the same reference numerals, and the descriptions of the common configurations are omitted appropriately.

As illustrated in FIG. 3, three lead terminals 15 are disposed side by side in the horizontal direction (the circumferential direction) of the vertical wall part 13. The anchor part 14 is configured by the concave portions 17 and the convex portions 18 formed on the inner surface 13a of the vertical wall part 13. Three convex portions 18 are arranged at positions corresponding to the lead terminals 15. Specifically, only one convex portion 18 is arranged a corresponding lead terminal 15. The convex portion 18 is disposed in such a way as to face the lead part 15b embedded in the vertical wall part 13. In the anchor part 14, the concave portion 17 may include a bottom surface parallel to the upper surface of the insulation plate 20 connected to the opposed surfaces 17a between the pair of opposed surfaces 17a. The convex portion 18 may include a top surface parallel to the upper surface of the insulation plate 20 connected to the opposed surfaces 18a between the pair of opposed surfaces 18a.

That is, the convex portion 18 is disposed between the lead part 15b rising in the height (z) direction and the connection portion where the wiring member W2 is connected to the terminal part 15a, in plan view. Providing the anchor part 14 in this manner according to the position of the lead terminal 15 can further enhance the adhesion of the sealing resin 16 (see FIG. 1) in the vicinity of the lead terminal 15 (particularly, the terminal part 15a). As a result, it is possible to effectively prevent the wiring member W2 from deteriorating at the connection portion where the wiring member W2 is connected to the terminal part 15a.

Further, as illustrated in FIG. 3, the tip of the terminal part 15a slightly protrudes toward the inside (the semiconductor elements 3) of the case than the inner surface 12a of the bottom wall part 12. For example, in a state where the interior of the case 11 is filled with the sealing resin 16, the peeling of the sealing resin 16 due to the heat cycle possibly progresses from the bottom part of the case 11.

Since the tip of the terminal part 15a protrudes from the bottom wall part 12 as mentioned above, even when the peeling of the sealing resin 16 occurs below the terminal part 15a, the peeling can be blocked by the lower surface side of the tip of the terminal part 15a. For this reason, the peeling of the sealing resin 16 does not progress into the connection portion between the terminal part 15a and the wiring member W2. That is, suppressing the progress of the peeling using the tip of the terminal part 15a can protect the connection portion between the terminal part 15a and the wiring member W2. Further, it is more effective if the upper surface of the tip of the terminal part 15a is arranged to be substantially parallel to the bottom surface of the concave portion 17 or the upper surface of the convex portion 18.

As described above, according to the present embodiment, since the pair of opposed surfaces 17a that define the concave portion 17 or the convex portion 18 configuring the anchor part 14 are made parallel, the mold for the case 11 can have a simple configuration vertically splittable, and the running cost can be suppressed because of reduction of the wear of the mold. Further, it is possible to improve the removal of air bubbles at the time of sealing while enhancing the anchor effects of the sealing resin 16.

Next, anchor parts according to modified embodiments will be described with reference to FIGS. 4A to 4F. FIGS. 4A to 4F are perspective views illustrating variable anchor parts according to modified embodiments.

Figures 4A, 4B:
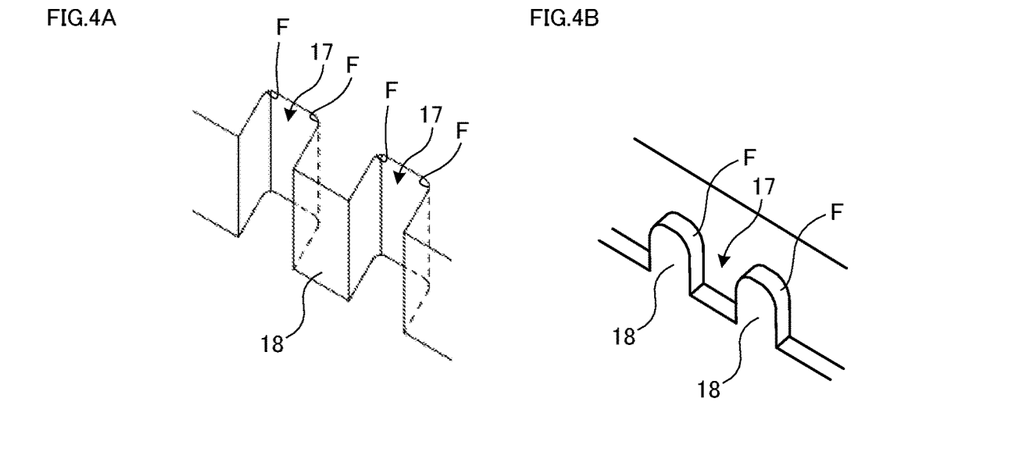
FIGS. 4A to 4F are perspective views illustrating various anchor parts according to modified embodiments.

For example, as illustrated in FIG. 4A, rounded fillet parts (creating a rounded transition between the adjacent faces) F may be formed at corners of respective concave portions 17. Further, as illustrated in FIG. 4B, fillet parts F may be formed at upper corners of respective convex portions 18. Forming the fillet parts F can reduce the wear of the mold and can suppress the running cost.

Figure 4C:
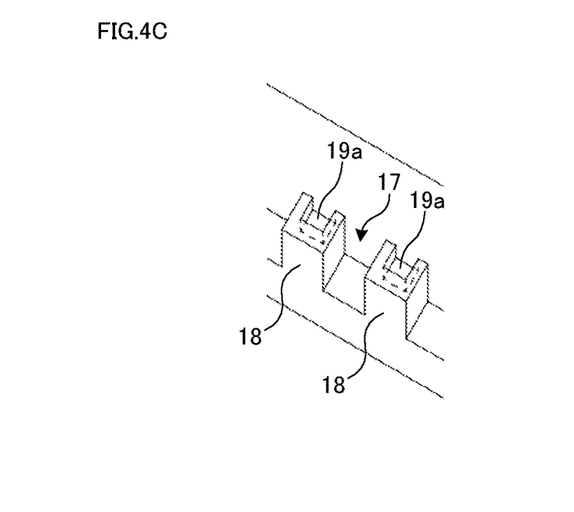
Figure 4D:
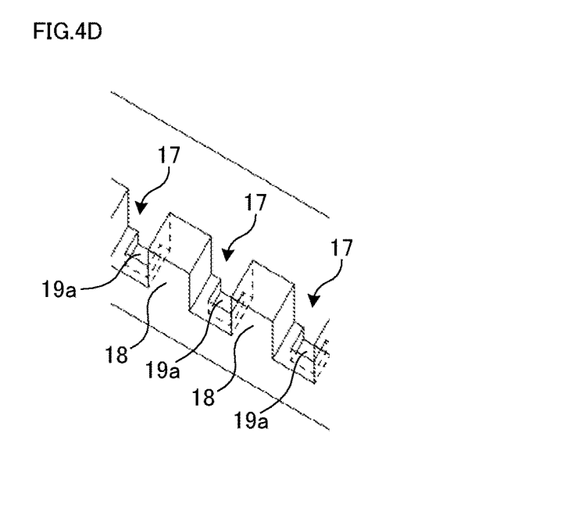
Figure 4E:
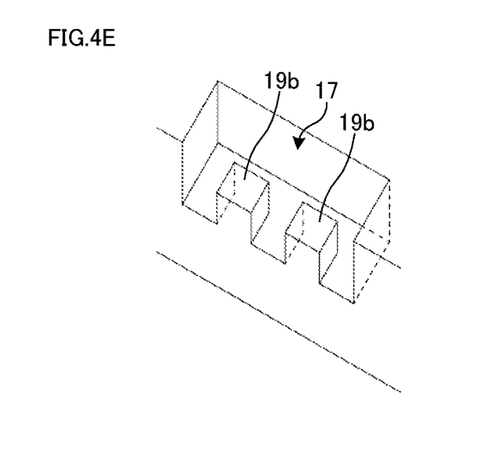
Figure 4F:
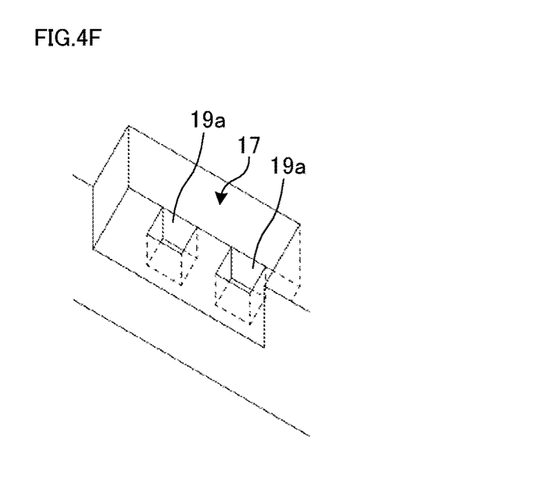

Further, as illustrated in FIG. 4C, a second concave portion 19a smaller than the convex portion 18 may be formed on the upper surface of the convex portion 18. Further, as illustrated in FIG. 4D, a second concave portion 19a smaller than the concave portion 17 may be formed on the bottom surface of the concave portion 17. The second concave portion 19a is, for example, formed to have a rectangular shape in plan view. Alternatively, a plurality of second convex portions 19b may be formed on the bottom surface of one concave portion 17. The second convex portion 19b protrudes upward from the bottom surface of the concave portion 17 and has, for example, a rectangular shape in plan view. Further, a plurality of second concave portions 19a may be formed on the bottom surface of one concave portion 17. The second concave portion 19a has, for example, a rectangular shape in plan view. Forming the second concave portion 19a or the second convex portion 19b can increase the contact area of the sealing resin 16 (not illustrated), thereby enhancing the anchor effects.

Further, although the above-described embodiment illustrates two semiconductor elements 3 arranged with respect to one first metal layer 21, the present invention is not limited to this configuration. Only one semiconductor element 3 may be provided, or three or more semiconductor elements 3 may be provided.

Further, although the above-described embodiment illustrates the semiconductor element 3 configured to have a rectangular shape in plan view, the present invention is not limited to this configuration. The semiconductor element may be formed in a polygonal shape other than the rectangular shape.

Further, in the above-described embodiment, the concave portions 17 and the convex portions 18 configuring the anchor part 14 can be changed appropriately with respect to shape, total number, arrangement location, and arrangement pitch. The same applies to the second concave portions 19a and the second convex portions 19b. In particular, the shape of the concave portion or the convex portion in plan view is not limited to the rectangular shape and may be a circular shape, a triangular shape, or a polygonal shape such as a pentagon.

Further, in the above-described embodiment, the anchor part 14 is configured to include both the concave portions 17 and the convex portions 18, but the present invention is not limited to this configuration. The anchor part 14 may be configured by only the concave portions 17 or by only the convex portions 18.

Further, in the above-described embodiment, although FIG. 3 illustrates the configuration of three lead terminals 15 arranged side by side, the present invention is not limited to this configuration. The number of lead terminals 15 to be arranged can be appropriately changed.

Further, in the above-described embodiment, although only one convex portion 18 is arranged for one lead terminal 15, the present invention is not limited to this configuration. The number or pitch of convex portions 18 to be arranged can be appropriately changed.

Further, in the above-described embodiment, the position where the fillet part F is provided can be arbitrarily selected. For example, in the modified embodiments illustrated in FIGS. 4C to 4F, the fillet parts F can be formed appropriately.

Figure 5A:
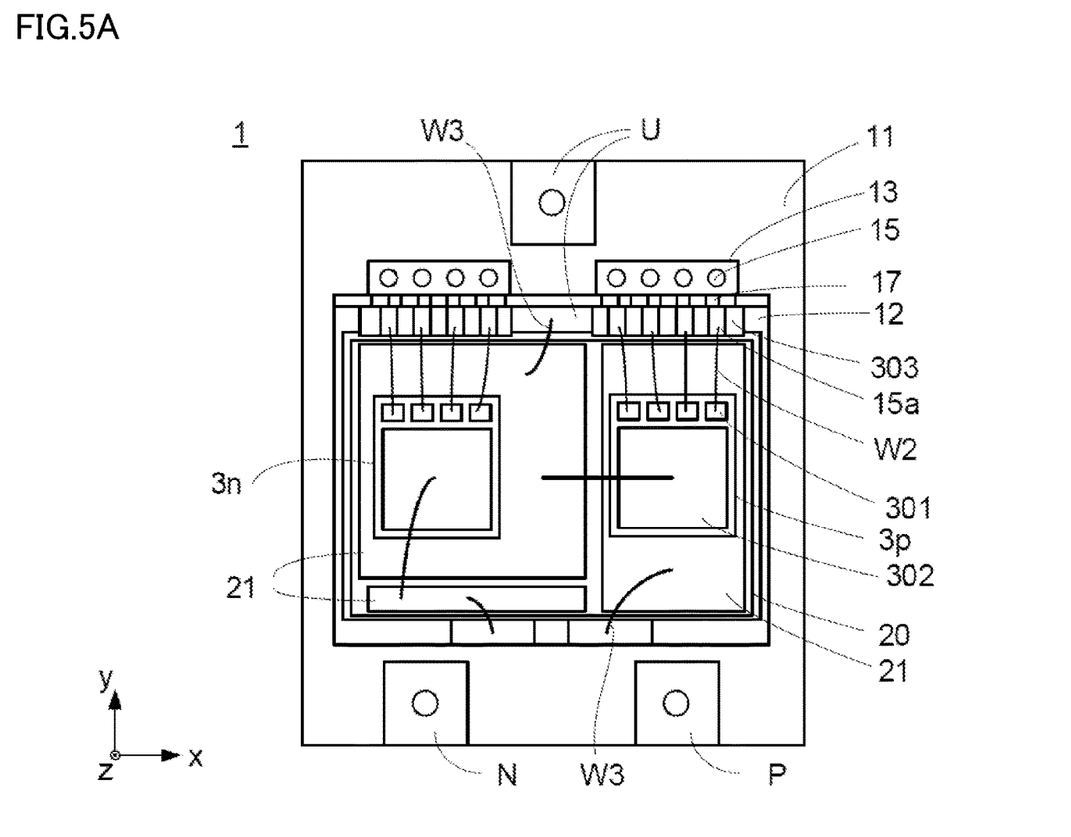
FIG. 5A is a plan view illustrating another example of the semiconductor device according to the present embodiment.
Figure 5B:
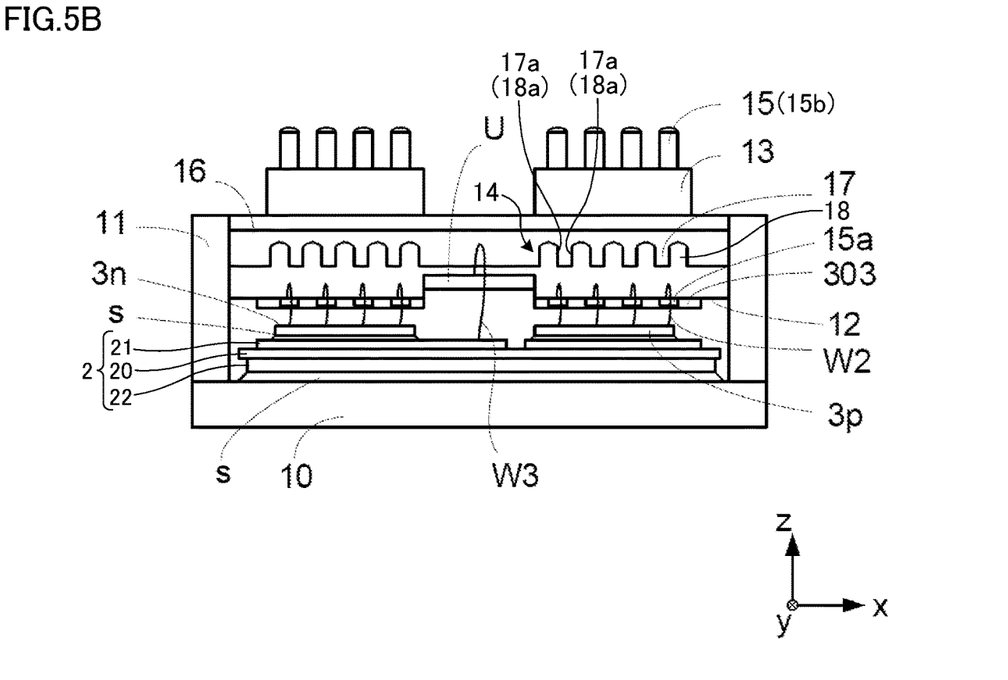
FIG. 5B is a schematic cross-sectional view of the semiconductor device illustrated in FIG. 5A, viewed from the y direction.
Figure 5C:
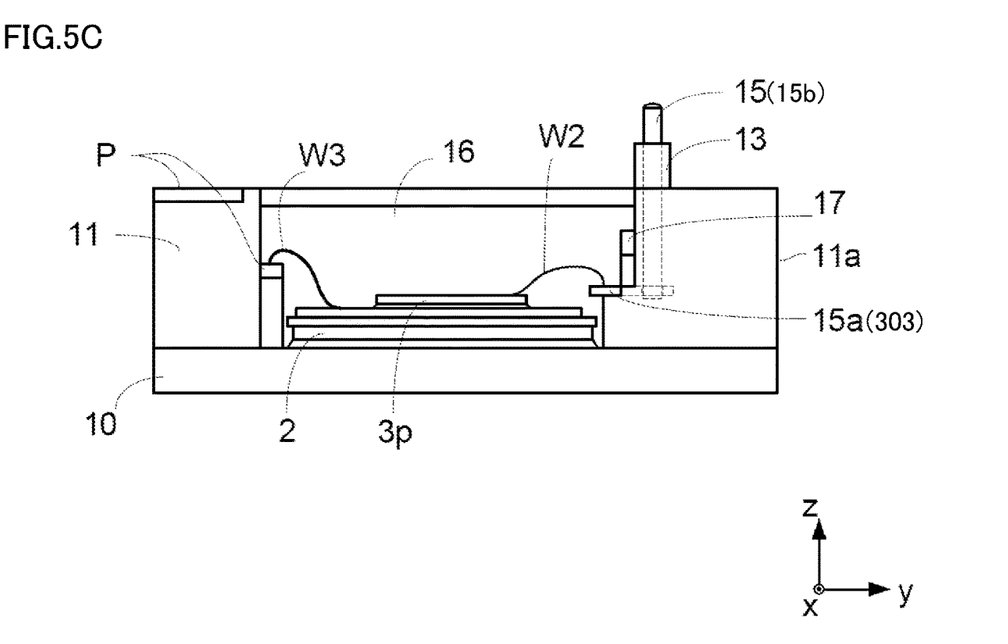
FIG. 5C is a schematic cross-sectional view of the semiconductor device illustrated in FIG. 5A, viewed from the x direction.
Figure 6:
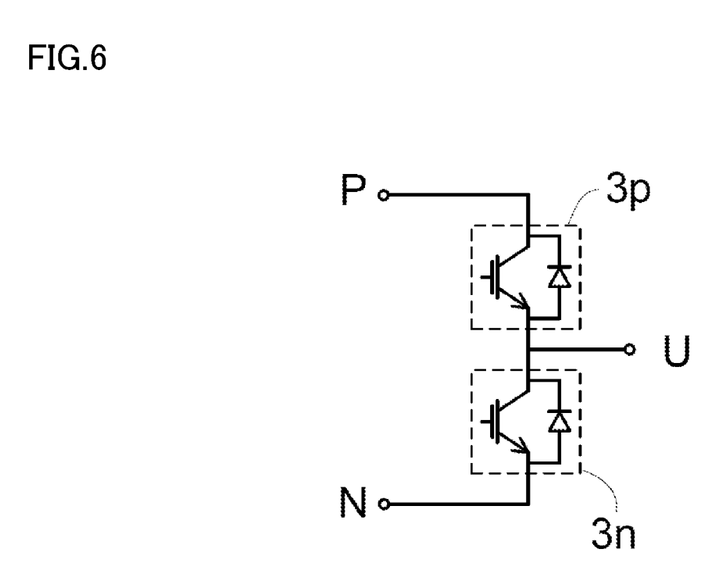
FIG. 6 is a circuit diagram illustrating a main circuit of the semiconductor device illustrated in FIGS. 5A to 5C.

Next, another example of the semiconductor device according to the present embodiment will be described with reference to FIGS. 5A to 5C and 6. FIG. 5A is a plan view of the semiconductor device 1, FIG. 5B is a schematic cross-sectional view of the semiconductor device 1 viewed in the y direction, and FIG. 5C is a schematic cross-sectional view of the semiconductor device 1 viewed in the x direction. FIG. 6 is a circuit diagram illustrating a main circuit of the semiconductor device 1 illustrated in FIGS. 5A to 5C. Various configurations of the semiconductor device 1 illustrated in FIGS. 5A to 5C are substantially the same as the configuration of the semiconductor device illustrated in FIGS. 1 and 3. Accordingly, the configurations having the same name are denoted by the same reference numeral in the following description.

As illustrated in FIGS. 5A to 5C, the semiconductor device 1 includes an insulated circuit board 2, semiconductor elements 3 (3p, 3n), lead terminals 15, wiring members W2, a case 11, and a sealing resin 16, like the previous embodiment. The semiconductor device 1 may further include a base plate 10.

The insulated circuit board 2 includes a second metal layer 22, an insulation plate 20, and a first metal layer 21 stacked in this order in the z direction. The insulation plate 20 has an upper surface and a lower surface parallel to the xy plane. The first metal layer 21 is disposed on the upper surface of the insulation plate 20, and the second metal layer 22 is disposed on the lower surface of the insulation plate 20. The insulated circuit board 2 may be bonded onto the base plate 10 by means of a bonding material such as solder or brazing material. Further, the first metal layer 21 includes a plurality of metal layers and may be provided with a circuit pattern.

Each semiconductor element 3 (3p, 3n) has an upper surface and a lower surface. The semiconductor element 3 may have upper surface electrodes 301, such as an emitter electrode and a source electrode, and a control electrode 302 on its upper surface side, and may have lower surface electrodes, such as a collector electrode and a drain electrode, on its lower surface side. The semiconductor element 3 may be bonded onto the first metal layer 21 by means of a bonding material such as solder or sintered material. The control electrode 302 can be electrically connected to an external control circuit via the wiring member W2 and the lead terminal 15. The semiconductor element 3 may be a switching element such as MOSFET, IGBT or RC-IGBT.

The lead terminal 15 has a terminal part 15a at one end side and a lead part 15b at the other end side. The terminal part 15a and the lead part 15b are separate members and may be connected in the case 11. The case 11 may be an integrally formed housing in which the terminal part 15a provided on a printed board 303 is connected to the lead part 15b provided in a block-shaped vertical wall part 13. The terminal part 15a and the printed board 303 protrude, at the tip thereof, from the inner surface of a side wall 11a of the case 11 in the y-axis negative direction.

The terminal part 15a and the printed board 303 may be arranged in the case 11 in such a manner that their upper surfaces are exposed from a bottom wall part 12. The base portion of the lead part 15b may be embedded in the vertical wall part 13 and the tip thereof may be inserted into a hole (not illustrated) of the printed board 303. The printed board 303 may be provided with copper foil wiring or the like formed on a resin plate of epoxy or phenol or a ceramic board of alumina or the like. The terminal part 15a and the control electrode 302 of the semiconductor element 3 are electrically connected by the wiring member W2.

The case 11 is a frame body having the side wall 11a disposed around the insulated circuit board 2 and the semiconductor elements 3. A region defined by the side wall 11a of the case 11 is filled with the sealing resin 16 so that the insulated circuit board 2, the semiconductor elements 3, the wiring members W2, and the terminal parts 15a are sealed. An anchor part 14 is formed on an inner surface of the side wall 11a of the case 11 between the terminal part 15a and the lead part 15b.

The anchor part 14 includes concave portions 17 and convex portions 18. The concave portions 17 and the convex portions 18 are arranged in the z direction. Each concave portion 17 includes a pair of opposed surfaces 17a that define the shape thereof. Each convex portion 18 includes a pair of opposed surfaces 18a that define the shape thereof. The opposed surfaces 17a and the opposed surfaces 18a are substantially parallel to each other, and may also be parallel to the z direction. The concave portions 17 and the convex portions 18 may be alternately arranged, and one concave portion 17 and a neighboring convex portion 18 may share the same opposed surface 17a or 18a.

The concave portion 17 may have an opening provided toward the z-axis positive direction (a first opening parallel to the upper surface of the insulated circuit board 2) and an opening provided toward a direction parallel to the xy plane (a second opening parallel to an inner surface of the vertical wall part 13). The concave portion 17 may have a bottom surface connected to the opposed surface 17a in the z-axis negative direction. A joint portion between the terminal part 15a and the wiring member W2 is fixed and protected by the concave portion 17 having the above-described shape and the sealing resin 16 covering the upper and lower surfaces of the terminal part 15a. This effect becomes prominent when the printed board 303 provided with the terminal parts 15a is used.

The semiconductor device 1 may further include input terminals P and N to be connected to a power supply and an output terminal U to be connected to a load. The terminals P, N, and U, the first metal layer 21, the semiconductor elements 3p and 3n and a wiring member W3 may be electrically connected to form a leg having upper and lower arms as illustrated in FIG. 6.

Moreover, although the present invention has been described based on the above embodiment and the modified embodiments, any possible combination of the above embodiment and the modified embodiments is employable as another embodiment.

Further, the present invention is not limited to the above-described embodiment and the modified embodiments and encompasses various changes, substitutions, and modifications that may be made without departing from the spirit of the technical idea. Further, if the technical idea can be realized in another way by the advancement of technology or another technique derived therefrom, the invention may be implemented using such a method. Accordingly, the claims attached below cover all embodiments that can be included within the scope of the technical idea.

In summary, the above-described embodiment has the following features.

The semiconductor device described in the above embodiment includes the insulated circuit board having an insulation plate with an upper surface and a lower surface, a first metal layer disposed on the upper surface, and a second metal layer disposed on the lower surface, a semiconductor element disposed on the first metal layer via a bonding material, a lead terminal having a terminal part on one end side and a lead part on the other end side, a wiring member that electrically connects the semiconductor element and the lead terminal, a housing having a side wall disposed around the insulated circuit board and the semiconductor element, and a sealing resin provided in a region defined by the housing to seal the insulated circuit board, the semiconductor element, the wiring member, and the terminal part. In the lead terminal, a tip of the terminal part protrudes from an inner surface of the side wall of the housing along a direction of the upper surface of the insulation plate, and a base portion of the lead part is embedded in the side wall. An anchor part is formed on the inner surface of the side wall of the housing between the terminal part and the lead part. The anchor part includes a concave portion or a convex portion arranged in a direction from the lower surface to the upper surface of the insulation plate, and a pair of opposed surfaces that define the concave portion or the convex portion are parallel to each other. One end of the wiring member is connected to an upper surface of the terminal part.

Further, in the semiconductor device according to the above-described embodiment, the housing has the bottom wall part in which a part of the one end side of the lead terminal is embedded, the one end side of the lead terminal protrudes, at least partly, from the bottom wall part, and an upper surface thereof is exposed from the bottom wall part.

Further, in the semiconductor device according to the above-described embodiment, a fillet part is formed at a corner of the concave portion or the convex portion.

Further, in the semiconductor device according to the above-described embodiment, the anchor part has the second concave portion smaller than the concave portion or the second convex portion smaller than the convex portion.

Further, in the semiconductor device according to the above-described embodiment, upper and lower surfaces of the tip of the terminal part are fixed by the sealing resin.

Further, in the semiconductor device according to the above-described embodiment, the concave portion has the opening provided from the lower surface to the upper surface of the insulation plate and the opening provided in the direction parallel to the upper surface of the insulation plate.

Further, in the semiconductor device according to the above-described embodiment, the sealing resin covers the concave portion.

As described above, the present invention brings about an effect of improving the removal of air bubbles at the time of resin sealing while suppressing the running cost of the mold, and is particularly useful for the semiconductor device.

What is claimed is:

1. A semiconductor device, comprising:
   an insulated circuit board including
      an insulation plate with an upper surface and a lower surface,
      a first metal layer disposed on said upper surface of the insulation plate, and a second metal layer disposed on the lower surface of the insulation plate;
   a semiconductor element disposed on the first metal layer via a bonding material;
   a housing having an inner space therein in which the insulated circuit board and the semiconductor element are disposed, and having a side wall surrounding the inner space, the side wall having an inner surface facing the circuit board and the semiconductor element, and having an anchor part formed in the inner surface;
   a lead terminal including
      a lead part, a part of which is embedded in the side wall of the housing, and a remaining portion of which protrudes upward from the side wall of the housing, the lead part extending in a direction parallel to the inner surface of the side wall and orthogonal to the upper surface of the insulation plate, and
      a terminal part connected to the lead part and extending in a direction orthogonal to a direction of the lead part, the terminal part having a base portion adjacent to the lead part and being embedded in the side wall of the housing, a remaining portion of the terminal part other than the base portion having an upper surface parallel to the upper surface of the insulation plate, a part of the upper surface of the remaining portion of the terminal part being exposed from the side wall of the housing;
   a wiring member having two ends opposite to each other, one of the two end of the wiring member being connected to the upper surface of the terminal part that is exposed from the side wall so as to electrically connect the semiconductor element to the lead terminal; and
   a sealing resin provided in the inner space of the housing to seal the insulated circuit board, the semiconductor element, the wiring member, and the terminal part, wherein
   the anchor part is disposed at a position within an area where the lead part is embedded and above the terminal part, the anchor part including a plurality of concave portions or convex portions, each of the concave portions or the convex portions being defined by a pair of opposed surfaces that are parallel to each other and are orthogonal to the upper surface of the insulation plate.

2. The semiconductor device according to claim 1, wherein
   the side wall of the housing includes an upper side wall and a lower side wall between the upper side wall and a bottom of the housing, the lower side wall having a thickness greater than a thickness of the upper side wall, the base portion of the terminal part being embedded in the lower side wall, the part of the upper surface of the remaining portion of the terminal part being exposed from the lower side wall of the housing.

3. The semiconductor device according to claim 1, wherein each of the concave portions or each of the convex portions includes a fillet part at a corner thereof.

4. The semiconductor device according to claim 1, wherein when the anchor part including the plurality of concave portions, each of the concave portions includes an additional concave portion therein.

5. The semiconductor device according to claim 1, wherein when the anchor part including the plurality of convex portions, each of the convex portions includes an additional convex portion therein.

6. The semiconductor device according to claim 1, wherein the remaining portion of the terminal part has a lower surface opposite to the upper surface, and the remaining portion of the terminal part is fixed by the sealing resin from the upper surface and the lower surface of the terminal part.

7. The semiconductor device according to claim 1, wherein
   each of the concave portions has a first opening parallel to the upper surface of the insulation plate, and a second opening parallel to the inner surface of the side wall of the housing.

8. The semiconductor device according to claim 1, wherein the sealing resin covers the concave portion.

* * * * *